United States Patent
Takada et al.

(10) Patent No.: US 6,977,805 B2
(45) Date of Patent: Dec. 20, 2005

(54) CAPACITOR ELEMENT, SEMICONDUCTOR INTEGRATED CIRCUIT AND METHOD OF MANUFACTURING THOSE

(75) Inventors: Shuichi Takada, Yokohama (JP); Nobuyuki Sasaki, Fuchu (JP)

(73) Assignees: Kabushiki Kaisha Toshiba, Tokyo (JP); Toshiba Solutions Corporation, Tokyo (JP)

( * ) Notice: Subject to any disclaimer, the term of this patent is extended or adjusted under 35 U.S.C. 154(b) by 0 days.

(21) Appl. No.: 10/884,342

(22) Filed: Jul. 1, 2004

(65) Prior Publication Data

US 2005/0030700 A1 Feb. 10, 2005

(30) Foreign Application Priority Data

Jul. 2, 2003 (JP) .............................. 2003-190315

(51) Int. Cl.⁷ ............................................. H01G 4/005

(52) U.S. Cl. .................. 361/303; 361/306.3; 361/311; 257/532; 438/240; 438/253

(58) Field of Search ............................... 361/303, 305, 361/306.3, 311–312, 329; 257/303, 306, 257/310, 532; 438/240, 244, 250, 253

(56) References Cited

U.S. PATENT DOCUMENTS 5,166,904 A * 11/1992 Hazani .................. 365/185.14

FOREIGN PATENT DOCUMENTS

| JP | P3193973 | 6/2001 |
| JP | P3209253 | 7/2001 |
| JP | P3307342 | 5/2002 |

* cited by examiner

*Primary Examiner*—Anthony Dinkins
(74) *Attorney, Agent, or Firm*—DLA Piper Rudnick Gray Cary US LLP

(57) ABSTRACT

A dielectric layer is formed on a first metal layer, the dielectric layer is formed with many concave portions at the upper surface. A second metal layer is formed on the dielectric layer, the second metal layer is formed with a convex portion at a position corresponding to each of many concave portions. A capacitances is generated between the first and second metal layers. The capacitor element is composed of the first metal layer, the dielectric layer and the second metal layer. The first and second metal layers are used as power supply interconnection, the capacitor element is connected between a pair of power supply interconnections. Further, the first metal layer is connected to reference voltage, and the second metal layer is used as a pad electrode. By doing so, a capacitor element is connected between the pad electrode and the reference voltage.

16 Claims, 3 Drawing Sheets

CAPACITOR ELEMENT, SEMICONDUCTOR INTEGRATED CIRCUIT AND METHOD OF MANUFACTURING THOSE

CROSS-REFERENCE TO RELATED APPLICATIONS

This application is based upon and claims the benefit of priority from prior Japanese Patent Application No. 2003-190315, filed Jul. 2, 2003, the entire contents of which are incorporated herein by reference.

BACKGROUND OF THE INVENTION

1. Field of the Invention

The present invention relates to a capacitor element, a semiconductor integrated circuit having a pair of mutually overlapping interconnection layers, and a method of manufacturing those. In particular, the present invention relates to a capacitor element structure, which can readily achieve large capacitances, and a method of manufacturing the same.

2. Description of the Related Art

A semiconductor integrated circuit is integrated with resistors and capacitor elements in addition to active elements such as transistors. There has been known a conventional capacitor element disclosed in Japanese Patents No. 3307342 and No. 3193973. The capacitor element disclosed in the foregoing Patents has the structure in which a dielectric layer is sandwiched between a pair of metal plates. In the capacitor element having the foregoing structure, the large capacitance is achieved to slim of the dielectric layer.

In addition, Japanese Patents No. 3209253 discloses a conventional capacitor element having the following structure. According to the structure, a pair of metal layers is arranged on the identical surface, and comb-shaped portions of the metal layers are overlapped with each other via a dielectric layer. In the capacitor elements having the foregoing structure, the large capacitance is achieved in the following manner. More specifically, the minimum dimension of the distance between the metal layers is made small, and the surface area of mutually overlapping comb-shaped portions is increased.

However, slimming of the dielectric layer and the minimum dimension of the distance between the metal layers are reaching the limit with the advance of process. For this reason, it is difficult to achieve the large capacitances.

BRIEF SUMMARY OF THE INVENTION

According to one aspect of the present invention, there is provided a capacitor element comprising:

a first metal layer;

a dielectric layer formed on the first metal layer; and a second metal layer formed on the dielectric layer, and provided with several convex portions at a surface facing the first metal layer.

According to another aspect of the present invention, there is provided a method of manufacturing a semiconductor integrated circuit, comprising:

forming a first metal layer on a semiconductor layer;

depositing a dielectric layer on the first metal layer;

forming an etching mask material having a predetermined opening pattern on the dielectric layer;

etching the dielectric layer using the mask material so that the dielectric layer is formed with several concave portions having a depth, which does not reach the surface of the first metal layer; and depositing metal on the dielectric layer after removed the mask material, planarizing the metal, and forming a second metal layer provided with several convex portions at a surface facing the first metal layer.

DETAILED DESCRIPTION OF THE INVENTION

Embodiments of the present invention will be described below with reference to the accompanying drawings.

Figure 1:
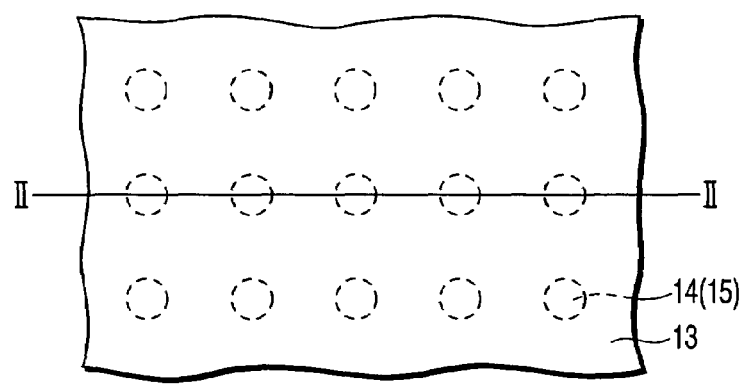
FIG. 1 is a top plan view showing a capacitor element according to a first embodiment of the present invention.
Figure 2:
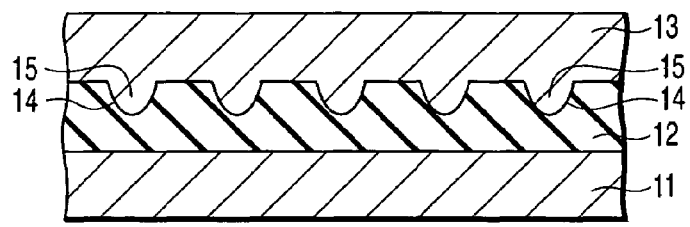
FIG. 2 is a cross-sectional view showing the capacitor element of FIG. 1.

FIG. 1 is a top plan view showing a capacitor element according to a first embodiment of the present invention, and FIG. 2 is a cross-sectional view showing the capacitor element of FIG. 1. The capacitor element is composed of first metal layer 11, dielectric layer 12 and second metal layer 13. The first metal layer 11 consists of Cu or Al formed on a semiconductor substrate. The dielectric layer 12 consists of silicon oxide film or and silicon nitride film formed on the first metal layer 11. The second metal layer 13 consists of Cu or Al formed on the dielectric layer 12.

The upper surface of the dielectric layer 13 is formed with many concave portions 14, as seen from FIG. 2. The second metal layer 13 is formed to bury these concave portions 14, and the upper surface is planarized. In other words, the second metal layer 13 has several convex portions 15 having a shape fitted into the concave portions 14 of the dielectric layer 12 at the surface facing the first metal layer 11.

In the capacitor element having the foregoing structure, the first and second metal layers 11 and 13 function as a pair of electrodes so that capacitance is generated between the electrodes. As described above, the second metal layer 13 is formed with several convex portions 15 at the surface facing the first metal layer 11. Thus, the second metal layer 13 has a larger surface area as compared with the case where it is not formed with several convex portions 15. In addition, the distance (film thickness) of the dielectric layer 12 between first and second metal layers 11 and 13 becomes partially shorter as compared with the case where it is not formed with several convex portions 15. As a result, the value of capacitance generated between the first and second metal layers 11 and 13 becomes larger as compared with the case where the film thickness of the dielectric layer 12 is set constant.

In the capacitor element according to the first embodiment, the lower surface of the second metal layer 13 is formed with several convex portions 15; therefore, a larger capacitance value is obtained. In addition, the number of the convex portions 15 is increased, and thereby, the capacitance value increases; therefore, large capacitances are readily achieved.

Figure 3A:
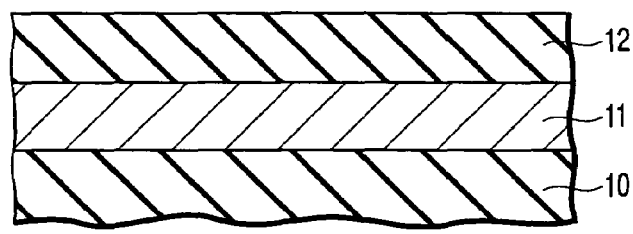
FIG. 3A to FIG. 3D is a cross-sectional view to explain the process of manufacturing the capacitor element of FIG. 1.

The method of manufacturing the capacitor element according to the first embodiment will be explained below with reference to FIG. 3A to FIG. 3D. As shown in FIG. 3A, the first metal layer 11 consisting of Cu or Al is formed on an insulating film 10 provided on a semiconductor substrate. The dielectric layer 12 consisting of silicon oxide film or and silicon nitride film is deposited on the first metal layer 11.

Figure 3B:
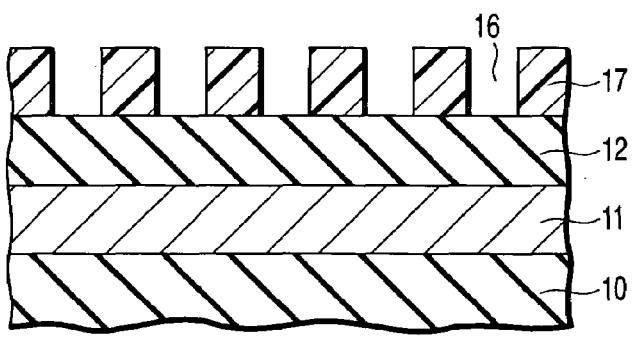

As illustrated in FIG. 3B, a resist mask 17 is formed on the dielectric film 12. In this case, the resist mask 17 is formed with an opening pattern having hole openings 16 at the positions corresponding to several concave portions 14 or convex portions 15 shown in FIG. 2.

Figure 3C:
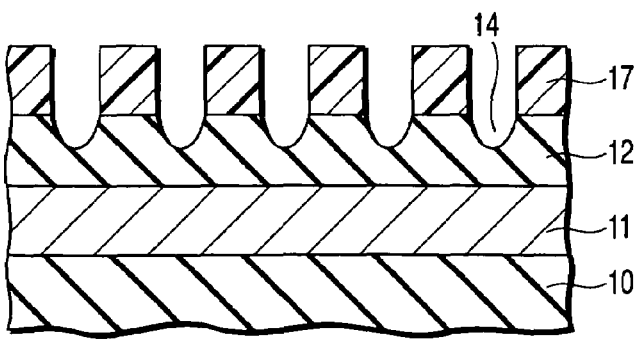

As depicted in FIG. 3C, the dielectric layer 12 is selectively etched by anisotropic etching using the foregoing resist mask 17, for example, reactive ion etching (RIE) technique. In this case, the dielectric layer 12 is etched by the depth, which does not reach the surface of the first metal layer 11. By doing so, the dielectric layer 12 is formed with several concave portions 14.

Figure 3D:
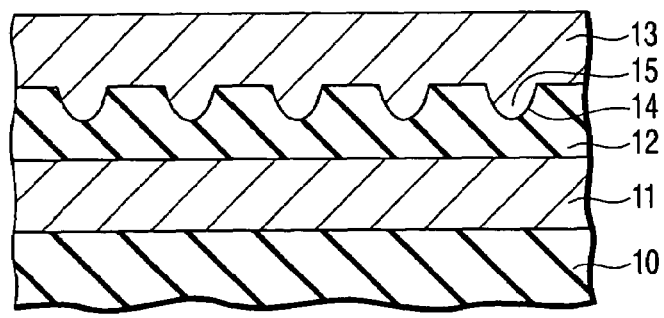

As seen from FIG. 3D, the resist mask 17 is entirely removed, and thereafter, metal consisting of Cu or Al is deposited. Further, the surface of the metal is planarized using chemical mechanical polishing (CMP); thus, the second metal layer 13 is formed. In this case, when the metal is deposited to form the second metal layer 13, the several concave portions 14 formed in the dielectric layer 12 are filled with the metal. Therefore, the second metal layer 13 is formed with several convex portions 15 at the surface facing the first metal layer 11, as shown in FIG. 3D.

In semiconductor integrated circuits, a capacitor for noise elimination is inserted in order to prevent malfunction by noise. In this case, the capacitor is interposed between a pair of power supply interconnections and between a pad electrode for making a signal exchange with external circuits and a reference potential.

The following is an explanation about the case where the present invention is applied to a semiconductor integrated circuit given below. The semiconductor integrated circuit has a capacitor inserted between the pair of power supply interconnects and between the pad electrode and the reference potential.

Figure 4:
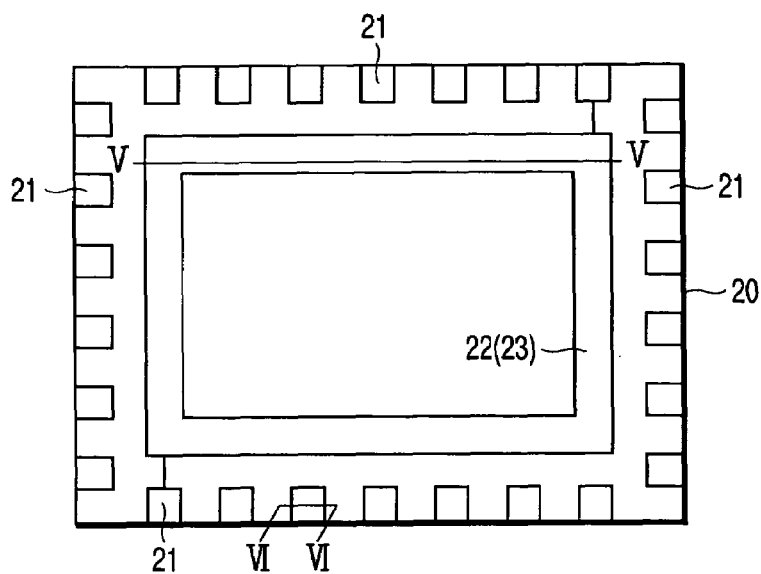
FIG. 4 is a top plan view showing a semiconductor integrated circuit chip according to a second embodiment of the present invention.

FIG. 4 is a top plan view showing a semiconductor integrated circuit chip (semiconductor chip) according to a second embodiment of the present invention. Many pad electrodes 21 are arranged at the peripheral portion on a semiconductor chip 20. The pad electrodes 21 consist of Cu or Al, and the surface is exposed. The exposed surface of the pad electrode 21 is connected with a bonding wire. On the semiconductor chip 20, first and second power supply interconnection layers 22 and 23 consisting of first and second metal layers are formed in a state of being electrically insulated from each other and vertically overlapped with each other. For example, the first power supply interconnection layer 22 supplies high potential power supply voltage to circuits on the chip and the second power supply interconnection layer 23 supplies low potential power supply voltage to circuits on the chip. The foregoing first and second power supply interconnection layers 22 and 23 are electrically connected with high and low potential power supply pad electrodes of many pad electrodes 21, respectively.

Figure 5:
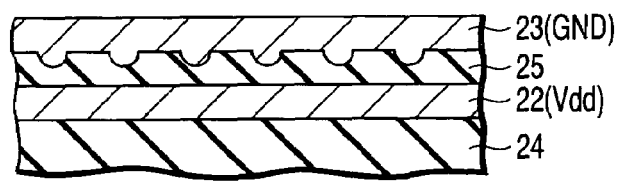
FIG. 5 is a cross-sectional view showing the chip of FIG. 4.

As shown in the cross-sectional view of FIG. 5, the following layers are successively formed on an interlayer insulating film 24 on the semiconductor substrate. More specifically, the first power supply interconnection layer 22 consisting of the first metal layer for supplying high potential power supply voltage Vdd is formed on the interlayer insulating film 24. A dielectric layer 25 consisting of silicon oxide film or silicon nitride film is formed on the first power supply interconnection layer 22. The second power supply interconnection layer 23 consisting of the second metal layer for supplying low potential power supply voltage (reference voltage) GDN is formed on the dielectric layer 25.

The surface of the dielectric layer 25 is formed with many concave portions like the case of the first embodiment. The foregoing second metal layer is formed so that it is filled in the concave portions of the dielectric layer 25, and the upper surface is planarized. In other words, the second power supply interconnection layer 23 consisting of the second metal layer has several convex portions having a shape fitted into the concave portions at the surface facing the first power supply interconnection layer 22.

In the first and second power supply interconnection layers 22 and 23 having the sectional structure shown in FIG. 5, two interconnection layers 22 and 23 function as a pair of electrodes, and thus, capacitance is generated between both electrodes. In this case, the second power supply interconnection layer 23 is formed with several convex portions at the surface facing the first power supply interconnection layer 22. Thus, the surface area of two interconnection layers becomes wider as compared with the case where several convex portions are not formed. In addition, the distance (film thickness) of the dielectric layer 25 between two interconnection layers becomes partially shorter as compared with the case where several convex portions are not formed. Thus, capacitance generated between two interconnection layers has a larger value as compared with the case where constant film thickness is given.

In brief, capacitance is generated between two interconnection layers 22 and 23, and also, the capacitance value is sufficiently made large from the same reason as the first embodiment. As a result, either of two power supply interconnection layers can easily release noise occurring in the first and second power supply interconnection layers 22 and 23 via the foregoing capacitor.

Figure 6:
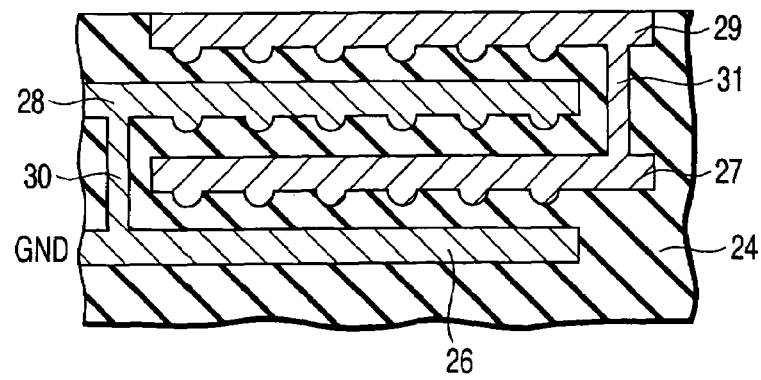
FIG. 6 is a cross-sectional view showing another structure of the chip of FIG. 4.

FIG. 6 is a cross-sectional view showing the structure of one pad electrode shown in FIG. 4. The dielectric layer, that is, the interlayer insulating film 24 is formed with a first metal layer 26 connected to low potential power supply voltage (reference voltage) GND. A second metal layer 27 is formed on the first metal layer 26 via the interlayer insulating film 24. Further, a third metal layer 28 is formed on the second metal layer 27 via the interlayer insulating film 24. Furthermore, a fourth metal layer 29 is formed on the third metal layer 28 via the interlayer insulating film 24. The foregoing first and third metal layers 26 and 28 are electrically connected via a via contact 30. Likewise, the foregoing second and fourth metal layers 27 and 29 are electrically connected via a via contact 31. The uppermost fourth metal layer 29 having an exposed surface is used as the pad electrode 21.

In this case, the second and fourth metal layers 27 and 29 each have several convex portions at their surfaces facing the first and third metal layers 26 and 28. The third metal layer 28 has several convex portions at their surfaces facing the second metal layers 27.

In the sectional structure shown in FIG. 6, capacitance is generated between the fourth metal layer 29 used as the pad electrode 21 and the second metal layer 27 electrically connected with the fourth metal layer 29 and between the first and third metal layers 26 and 28. As described above, the fourth metal layer is formed with several convex portions at the surface facing the third metal layer 28. Thus, the surface area of two metal layers becomes wider as compared with the case where several convex portions are not formed. In addition, the distance (film thickness) of the interlayer insulating film 24 between two metal layers becomes partially shorter as compared with the case where several convex portions are not formed. As a result, the value of capacitance generated between two metal layers becomes large as compared with the case where the film thickness of the interlayer insulating film 24 is set constant. Likewise, the same effect as described above is obtained between the third and second metal layers 28 and 27 and between the second and first metal layers 27 and 26.

Figure 7:
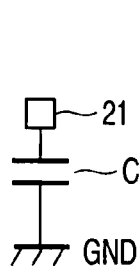
FIG. 7 is an equivalent circuit diagram of a pad of the chip of FIG. 4.

More specifically, a capacitor C is formed between the pad electrode 21 and the reference voltage GND, as seen from the equivalent circuit diagram of FIG. 7. The value of the capacitor C is sufficiently made large from the same reason as the first and second embodiments. As a result, a reference voltage GND node can easily release noise occurring in the pad electrode 21 via the capacitor C.

The semiconductor integrated circuit chip of the second embodiment employs the structure given above. That is, the second power supply interconnection layer 23 for supplying low potential power supply voltage GND is provided at the layer upper than the first power supply interconnection layer 22 for supplying high potential power supply voltage Vdd. In this case, the structure contrary to above may be employed. That is, the second power supply interconnection layer 23 for supplying low potential power supply voltage GND is provided at the layer lower than the first power supply interconnection layer 22 for supplying high potential power supply voltage Vdd.

In semiconductor integrated circuits, in particular, analog semiconductor integrated circuits, circuits using the capacitor element as a circuit component are frequently used.

Figure 8:
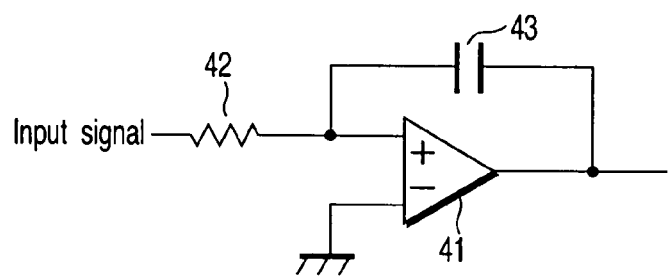
FIG. 8 is a circuit diagram showing an integrator circuit using the capacitor element.

FIG. 8 shows an integration circuit using the capacitor element as a circuit component. One input terminal of an operational amplifier 41 is supplied with an input signal via a resistor element 42. The other input terminal of the operational amplifier 41 is grounded. A capacitor element 43 for integration is connected between an output terminal of the operational amplifier 41 and one input terminal thereof.

In general, the capacitor element occupies a large area as compared with transistor and resistor element in the semiconductor integrated circuit. Therefore, if a capacitor element having a large capacitance value with small area is formed, the chip area of the semiconductor integrated circuit is reduced, and also, the semiconductor integrated circuit is manufactured cost is at low cost.

Figure 9:
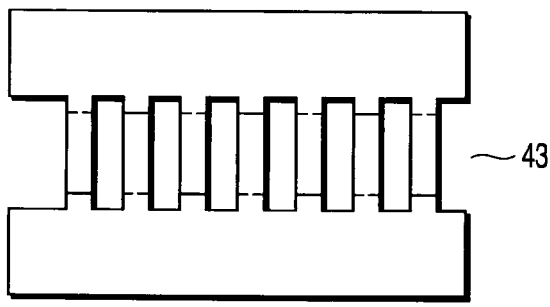
FIG. 9 is a top plan view showing the pattern of a capacitor element according to a third embodiment of the present invention.

FIG. 9 is a top plan view showing the pattern of a capacitor element according to a third embodiment of the present invention. The capacitor element according to the third embodiment may be used as the capacitor element 43 included in the integration circuit shown in FIG. 8. A capacitor element shown in FIG. 9 is formed in a manner of stacking multi-layer metal layers via a dielectric layer.

Figure 10A:
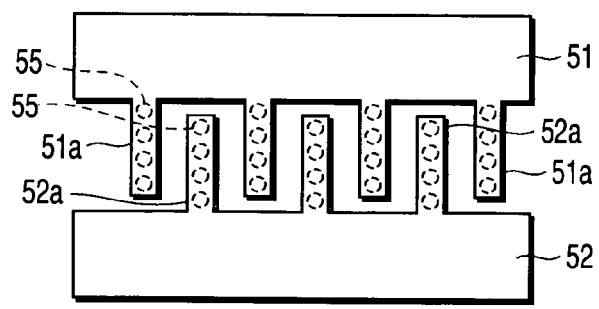
FIG. 10A and FIG. 10B are top plan views showing the pattern of another metal layer of the capacitor element shown in FIG. 9.

FIG. 10A is a plan view showing the pattern of one metal layer of the foregoing metal layers. A pair of metal layers 51 and 52 is arranged so that their longer sides become parallel with each other. The metal layers 51 and 52 are formed with comb-shaped portions 51a and 52a, which extend vertically to their longer sides, respectively. A dielectric layer is interposed between the comb-shaped portions 51a and 52a, and thereby, a capacitor is formed between the metal layers 51 and 52.

Figure 10B:
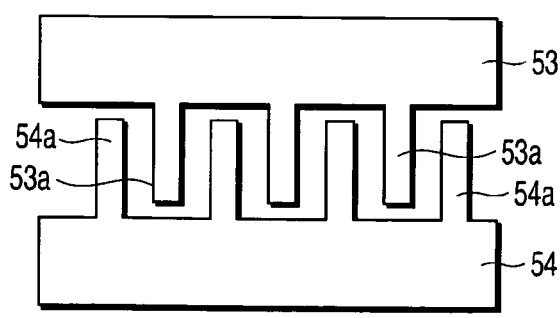

FIG. 10B is a plan view showing the pattern of a metal layer positioned under the metal layer shown in FIG. 9. In also case, a pair of metal layers 53 and 54 is arranged so that their longer sides become parallel with each other. The metal layers 53 and 54 are formed with comb-shaped portions 53a and 54a, which extend vertically to their longer sides, respectively. A dielectric layer is interposed between the comb-shaped portions 53a and 54a, and thereby, a capacitor is formed between the metal layers 53 and 54.

The metal layers 51 and 53 are electrically connected so that they function as one electrode of the capacitor element. The metal layers 52 and 54 are electrically connected so that they function as the other electrode of the capacitor element.

In this case, the upper metal layer 51 and the lower metal layer 54 are formed so that their comb-shaped portions 51a and 54a overlap with each other via the dielectric layer. In addition, the comb-shaped portions 51a are formed with several convex portions 55 made of the same material as the metal layer 51 at the surface facing the comb-shaped portions 54a, like the first embodiment. Likewise, the upper metal layer 52 and the lower metal layer 53 are formed so that their comb-shaped portions 52a and 53a overlap with each other via the dielectric layer. In addition, the comb-shaped portions 52a are formed with several convex portions 55 made of the same material as the metal layer 51 at the surface facing the comb-shaped portions 53a, like the first embodiment.

In the capacitor element of the third embodiment, the upper metal layer (51, 52) is formed with several convex portions at the surface facing the lower metal layer (53, 54). Thus, large capacitances can be facilitated as compared with the case where the metal layer is simply arranged on the plane. In other words, it is possible to form a capacitor having a large capacitance value with the same area as the conventional case.

The capacitor element of the third embodiment has the structure in which two metal layers are provided. Three or more metal layers are provided, and thereby, it is possible to form a capacitor having a lager capacitance value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A capacitor element comprising:
  a first metal layer having an upper surface that is entirely planarized;
  a dielectric layer formed on the first metal layer; and
  a second metal layer formed on the dielectric layer, and provided with several convex portions at a surface facing the first metal layer.

2. The capacitor element according to claim 1, wherein the dielectric layer is formed with a concave portion at the position corresponding to said each several convex portions of the second metal layer.

3. The capacitor element according to claim 1, wherein the first and second metal layers comprise any one of Cu and Al.

4. The capacitor element according to claim 1, wherein the dielectric layer comprises any one of a silicon oxide film and a silicon nitride film.

5. A semiconductor integrated circuit comprising:
a first power supply interconnection layer formed of a first metal layer, and supplied with a first power supply voltage;
a dielectric layer formed on the first power supply interconnection layer; and
a second power supply interconnection layer formed on the electric layer, formed of a second metal layer provided with several convex portions at a surface facing the first power supply interconnection layer, and supplied with a second power supply voltage,
a capacitor element including the first metal layer, the dielectric layer and the second metal layer being formed between the first and second power supply interconnection layers.

6. The circuit according to claim 5, wherein the dielectric layer is formed with a concave portion at a position corresponding to said each several convex portions of the second power supply interconnection layer.

7. The circuit according to claim 5, wherein the first and second power supply interconnection layers comprise any one of Cu and Al.

8. The circuit according to claim 5, wherein the dielectric layer comprises any one of a silicon oxide film and a silicon nitride film.

9. A semiconductor integrated circuit comprising:
a first metal layer connected to a reference voltage;
a dielectric layer formed on the first metal layer; and
a pad electrode formed on the dielectric layer, and formed of a second metal layer provided with several convex portions at a surface facing the first metal layer.

10. The circuit according to claim 9, wherein the dielectric layer is formed with a concave portion at a position corresponding to said each several convex portions of the pad electrode.

11. The circuit according to claim 9, wherein the first and second metal layers comprise any one of Cu and Al.

12. The circuit according to claim 9, wherein the dielectric layer comprises any one of a silicon oxide film and a silicon nitride film.

13. A method of manufacturing a semiconductor integrated circuit, comprising:
forming a first metal layer on a semiconductor layer;
depositing a dielectric layer on the first metal layer;
forming an etching mask material having a predetermined opening pattern on the dielectric layer;
etching the dielectric layer using the mask material, the dielectric layer being formed with several concave portions having a depth, which does not reach the surface of the first metal layer; and
depositing metal on the dielectric layer after removing the mask material, planarizing the metal, and forming a second metal layer provided with several convex portions at a surface facing the first metal layer.

14. The method according to claim 13, wherein the first metal layer forms one electrode of a capacitor element, and the second metal layer forms the other electrode of the capacitor element.

15. The method according to claim 13, wherein the first metal layer forms a first power supply interconnection layer, and the second metal layer forms a second power supply interconnection layer.

16. The method according to claim 13, wherein the first metal layer forms a first metal layer connected with a reference voltage, and the second metal layer forms a pad electrode.

* * * * *